United States Patent [19]

Boutros

[11] 4,143,932

[45] Mar. 13, 1979

[54] MODULAR INTERCONNECT ASSEMBLY FOR TELECOMMUNICATIONS SYSTEMS

[75] Inventor: Kamal S. Boutros, Downsview, Canada

[73] Assignee: Bunker Ramo Corporation, Oak Brook, Ill.

[21] Appl. No.: 874,610

[22] Filed: Feb. 2, 1978

Related U.S. Application Data

[63] Continuation of Ser. No. 760,909, Jan. 21, 1977, abandoned.

[51] Int. Cl.[2] .......................... H05K 7/10; H05K 3/32

[52] U.S. Cl. .................................... 339/17 F; 29/626; 220/62; 339/18 B; 339/126 R; 361/398; 361/429

[58] Field of Search ............. 339/4, 18 R, 18 B, 17 R, 339/17 F, 17 N, 121, 126; 29/626, 629; 361/380, 395, 398, 399, 410, 429; 179/98; 220/3.2, 6, 62; 312/258, 259

[56] References Cited

U.S. PATENT DOCUMENTS

| | | | |
|---|---|---|---|
| 2,703,853 | 3/1955 | Chrystie | 361/398 |
| 2,880,378 | 3/1959 | Lindseth | 361/398 |
| 3,337,950 | 8/1967 | Gray | 29/626 |
| 3,427,715 | 2/1969 | Mika | 361/398 |
| 3,846,590 | 11/1974 | McLain | 179/98 |
| 3,970,802 | 7/1976 | Nijman | 179/98 |
| 3,971,127 | 7/1976 | Giguere et al. | 361/398 |
| 3,999,826 | 12/1976 | Yurtin | 339/17 F |

*Primary Examiner*—Neil Abrams
*Attorney, Agent, or Firm*—William Lohff; F. M. Arbuckle

[57] ABSTRACT

Bodies, or frames, of use in the formation of modular interconnect terminals, or terminal modules are shown. The bodies are formed, characteristically, from single pieces of material to include pockets or receptacles into which electrical contact elements may be fitted. Each body, or frame, includes regions about which it may be folded to provide a four-sided box-like structure. Before being folded the body is equipped with electrical contact elements which it supports in such a way that first terminals of the contact elements are accessible from outside the folded structure. A flexible printed circuit board having conductors arranged in patterns on at least one face is folded within the box-like structure and its conductors are connected to second terminals of the contact elements to provide selected interconnections between the electrical contact elements.

28 Claims, 4 Drawing Figures

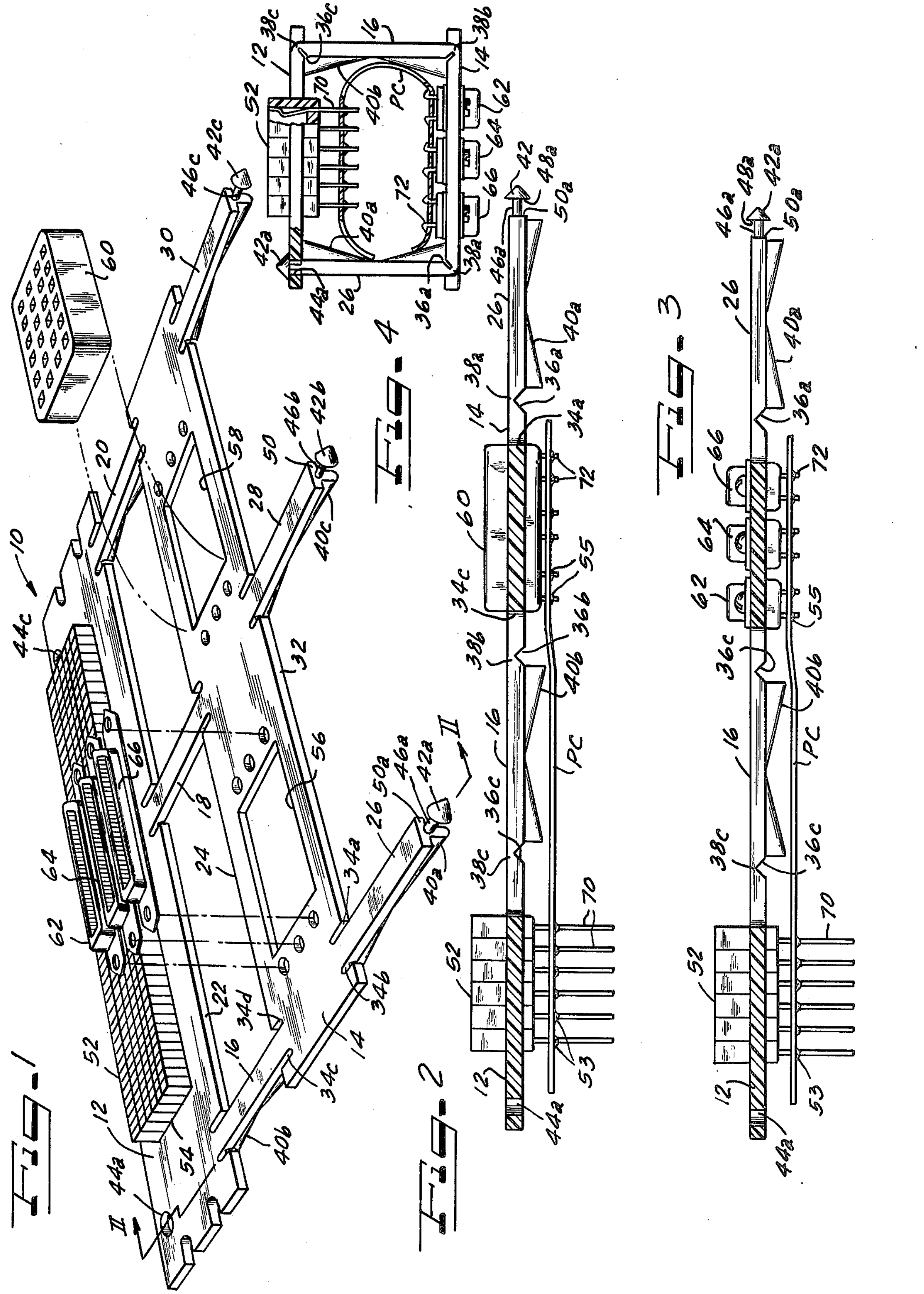

MODULAR INTERCONNECT ASSEMBLY FOR TELECOMMUNICATIONS SYSTEMS

This is a continuation, of application Ser. No. 760,909, filed Jan. 21, 1977 now abandoned.

BACKGROUND OF THE INVENTION

1 Field of the Invention

The invention relates to terminal modules, or modular interconnect terminals, and to components of such terminal modules for use in establishing interconnections between parts of telecommunication systems and the like. More particularly, it relates to unit frames or bodies of use in electrical interconnection modules, or terminal modules and to modules formed by folding the unit frames into box-like structures. The frames are equipped with standard connectors bearing contacts and/or have contacts molded into them so that each frame supports a plurality of individual contacts. The contacts are interconnected on a selective basis by means of conductors on flexible circuit boards so that the boards are supported by the unit frames. The unit frames include regions about which they may be bent to form box-like terminal modules and include latching means which may be engaged to secure the modules as units.

DESCRIPTION OF THE PRIOR ART

Prior art telephone termination systems, and particularly those used in association with key telephones in business office environments, have required excessive expenditures of both time and money for installation, for maintenance and for changes in the wiring systems after they have been installed.

Examples of prior art modular connectors are shown in J. P. Nijman in U.S. Pat. No. 3,970,802 entitled "Flexible Circuit Connecting Arrangement for Interconnection Modules", and assigned to the same assignee as the present invention.

In U.S. Pat. No. 3,970,802 a pair of spaced apart plates are positioned back-to-back with each plate supporting a matrix of connector terminals. The connector terminals project into the space between the back sides of the plates and are interconnected in prearranged patterns which permit interconnections between subscriber telephones and certain common equipment to be easily established or altered by engaging mating connector contacts with the contacts at the front sides of the respective plates. A flexible plastic sheet bearing a printed circuit arranged in the desired pattern enables the ready interconnection of the connector terminals between the spaced apart plates, thereby providing a flexible and efficient means for interconnecting the connector terminals. However, using the apparatus shown in Nijman it is necessary to separately fabricate the plates and to separately handle the plates and the printed circuit boards in order to establish connectors between contacts in the plates. It is then also necessary to secure the plates and the printed circuit together in the spaced apart relationships by means of spacers, nuts and bolts. Therefore, to produce the Nijman apparatus a considerable expenditure of time and money is required and the resulting apparatus is unduly complex.

SUMMARY OF THE INVENTION

In view of the foregoing, a primary object of the present invention is to provide improved and more economical terminal unit frames and terminal modules for use in telecommunication systems and the like. One object is to provide terminal unit frames with substantially coplanar panels supporting contacts for interconnection by soldering from a common direction, with the frames being thereafter foldable to place the panels in a spaced-apart back-to-back relationship. It is a further object to provide terminal unit frames and terminal modules of simplified construction which at the same time enable a reduction in the possibilities for errors in the interconnections through the modules. It is an additional object to provide terminal modules which may be more readily assembled than the modules available heretofore. It is yet an additional object to provide terminal modules enabling greater flexibility in the number and kinds of contacts which may be supplied and in the interconnections between contacts.

To attain the foregoing and related objects, unit frames or bodies are provided with hinge regions about which they may be folded and with pockets, or receptacles, into which electrical contact elements may be fitted. For use as modular interconnect modules, the bodies are fitted with a plurality of electrical contacts in respective front and back panels forming the bodies. The electrical contacts may be supplied to the frames by molding the contacts into the plates or by placing individual contacts or standard connectors bearing contacts into prepared sockets in the plates. Connections between contacts in the front plate and contacts in the back plate are completed by a flexible printed board having a desired conductive pattern on at least one face or by a plurality of individual conductors. Terminal modules in accordance with the invention are formed by folding the unit frames through angles of 90 degrees in three preprepared places. The frames are held in a folded four-sided box configuration by locking elements or spigots extending from an edge of the back plate to engage holes near one edge of a front plate.

BRIEF DESCRIPTION OF THE DRAWINGS

The above mentioned and other features and objects of this invention and the manner of obtaining them will become more apparent, and the invention itself will be best understood by reference to the following description of an embodiment of the invention taken in conjunction with the accompanying drawings, in which:

FIG. 1 is a perspective view of a flat plastic piece suitable for use as the unit frame of a terminal module in accordance with the invention, FIG. 2 is a side view of the plastic piece in FIG. 1, taken along line II—II, and showing additional elements including connectors and contact elements in place together with a printed circuit board, FIG. 3 is a side view similar to FIG. 2, taken along line II—II of FIG. 1, but showing other connectors and contact elements, and FIG. 4 is a side elevational view of a terminal module according to the invention in its finished state.

DESCRIPTION OF PREFERRED EMBODIMENTS

Turning to FIG. 1, an essentially flat plastic plate of piece, which may be used as a unit frame, is indicated at 10. The plastic piece, or unit frame, may be an integral sheet or thermoplastic which has been moulded or otherwise formed to include planar and rectangular members or panels 12 and 14 which are interconnected between their edges 22 and 24 by a plurality of interconnecting struts, posts or standards such as 16, 18 and 20. A series of spaced cantilever struts 26, 28 and 30, which in a preferred embodiment are aligned with the struts 16, 18 and 20, are extended from the edge 32 of the plate 14. The plates may be called the first panel or back panel 12 and the second panel or front panel 14 for purposes of identification.

Cutouts, or slots, 34*a*, 34*b*, 34*c* etc. are provided in each plate, or unit frame, adjacent to the sides of each of the struts 16, 18, 20, 26, 28, 30 to extend the struts into the plate. Bevel cutouts, identified as 36*a*, 36*b*, 36*c* etc. in FIG. 2, are formed in each strut near the juncture of the strut with a plate to leave a narrow neck portion 38*a*, 38*b*, 38*c* etc. and thus provide hinge areas or hinge means. The struts may be folded about each of the hinge means by a full 90 degrees to form corners of the structure as shown in FIG. 4. Ribs 40*a*, 40*b*, 40*c* etc., formed preferably of plastic material integral to the plate 10, extend along each of the struts and extend out from the struts in a direction orthogonal to planes parallel to the plates and struts. The ribs 40*a*, 40*b* etc. give support for the struts and make the assembly of FIG. 4 more rigid.

Locking or latching means integral to the plate 10 are provided to enable the assembly to be locked in the position of FIG. 4. The locking means includes protrudences 42*a*, 42*b* and 42*c*, which may be called retention spigots, integral to the corresponding projecting cantilever struts or standards 26, 28, 30. Each of the protrudences is received and held by one of a plurality of appropriately positioned apertures 44*a*, 44*b*, 44*c* spaced along one edge of plate 12. The spigots 42*a*–42*c* are each of conical shape for easy entrance into the appropriate aperture. A portion 46*a*, 46*b* or 46*c* of reduced cross section is located behind the wide portion of each spigot and shoulders 48*a*, 48*b*, 48*c* and 50*a*, 50*b*, 50*c* form bounderies of sections 46*a*, 46*b*, 46*c* which engage the plate around apertures 44*a*, 44*b*, 44*c* and hold the plates in the back-to-back relationship of FIG. 4.

In FIG. 1, contact pockets to receive contacts are indicated in the front panel 12 at 52. These contact pockets, as preformed units, may be inserted into a hold at 54 in the front panel 12 or may be molded as a part of the front panel. Similarly, openings 56, 58 in the back plate 14 can be used to support a variety of connectors; or in preferred instances, receptacles for contacts may be formed as the plate 14 is made, and contacts may then be inserted in the receptacles. Suitable connectors are indicated at 60 and 62, 64, 66.

FIG. 2 is a side view in partial section of a plastic piece, taken along the lines II—II of FIG. 1, showing connectors and contact elements in place and a printed circuit board PC secured by solder or the like at 53 and 55 in position against the contact elements. Exemplary contact pockets 52 are shown in position in the front plate 12. As indicated above, preprepared pockets, or assemblies of pockets, may be inserted into an opening in plate 12 or they may be molded as part of plate 12, requiring then that contact elements be inserted as a manufacturing step for terminal modules in accordance with the present invention. Contact elements at 70 are oriented in a common direction and supported by substantially coplanar panels 12 and 14 to enable electrical connection to the printed circuit board PC through soldered points at 53 or the like as well as provide mechanical support between printed circuit board PC and panel 12. Interconnection of the contact elements in the flat panels and the flexible printed circuit board is accomplished by the application of solder from a common direction.

Separate connectors 60 are indicated to be present in the openings, 56, 58 of back plate 14. Here also the connectors 60 may be molded in a preferred example into plate 14 and the contact elements may be inserted as a step in manufacturing terminal modules in accordance with the invention. If separate connectors are employed at 60 they may be standard connectors shown in the aforementioned U.S. Pat. No. 3,970,802. Contact elements at 72 provide electrical connections to the printed circuit board PC as indicated by solder at 55 as well as mechanical connections between PC and back plate 14.

FIG. 3 is a side view of a plastic piece much like the view shown in FIG. 2. In FIG. 3, a plurality of connectors is indicated at 62, 64, 66 which may be "57 series connectors" produced by the Amphenol Division of Bunker Ramo Corporation, the assignee of the present invention.

FIG. 4 is an illustration of a terminal module assembled for use in accordance with the invention. In this view, the embodiment of the invention shown in FIG. 3 is shown folded and locked in position by interaction of the retention spigots 42*a*, 42*b*, 42*c* in the respective apertures 44*a*, 44*b*, 44*c*.

Preparation and assembly of the terminal module of FIG. 4 involves a number of steps including the preparation of a piece of flexible material as shown in FIG. 3 by casting, cutting, drilling and the like to provide plates 12 and 14; contact pockets 52; struts 16, 18, 20, 26, 28 and 30; the retention spigots 42*a*, 42*b*, 42*c*, the orifices 44*a*, 44*b*, 44*c*; the ribs 40*a*, 40*b*, 40*c*, 40*d* etc; the bevel cutouts 36*a*, 36*b*, 36*c*; etc. A printed circuit board is prepared, using conventional techniques to establish selected paths between various spots on the board. The piece of material 10 is then provided with terminals incorporating contact elements and with individual contact elements which are placed in contact pockets to establish contacts 70, 72. The printed circuit board is secured by soldering or the like at points such as 53, 55 to the contacts 70, 72 to prepare the terminal module to the state shown in FIG. 3. Thereafter, the flat plastic piece with the attachment is folded about the three hinges or narrow neck portions 38*a*, 38*b*, 38*c* to form a box-like structure. Retention spigots 42*a*, 42*b*, 42*c* are inserted then in apertures 44*a*, 44*b*, 44*c* to lock the terminal module in the configuration shown in FIG. 4.

While the principles of the invention have been described above in connection with specific apparatus and applications, it is to be understood that this description is made only by way of example and not as a limitation on the scope of the invention.

I claim:

1. In a modular interconnect terminal of use in establishing electrical interconnections, a body to serve as a frame, comprising as integrally formed
   - a first panel and a second panel, and
   - a plurality of integral, elongated struts extending between and interconnecting one side of the first panel with one side of the second panel, each end of each said strut being secured to an adjoining panel by hinge means associated with said strut to enable said strut and said adjoining panel to be folded relative to each other,
   - each said hinge means including slots disposed in said adjoining panel on each side of said strut to extend said strut into said panel, and a transverse scoring groove disposed in the surface of said strut between said slots.

2. The modular interconnect terminal body as claimed in claim 1, wherein said body further includes at least one cantilevered strut connected to and extending from the second panel on the side opposite said plurality of elongated, interconnecting struts, each said cantilevered strut being secured to said second panel by one said hinge means about which the cantilevered strut may be folded, first latching means associated with each said cantilevered strut, and second latching means associated with the first panel, said second latching means being adapted to latch with said first latching means when all said struts are folded along their hinge means to align said first and second panels in an overlapping spaced-apart relation.

3. The modular interconnect terminal body as claimed in claim 2, in which all said struts are folded about said hinge means, the first latching means is latched to said second latching means to form a modular interconnect terminal, and wherein each said integral elongated strut includes a support rib disposed longitudinally along one surface thereof between the scoring grooves disposed at the end portions of said strut, and each said cantilevered strut includes a support rib disposed longitudinally along one surface thereof between said first latching means and the scoring groove disposed at its fixed end, each said support rib including means for limiting movement of its associated strut relative to an adjoining panel during folding of said body.

4. The modular interconnect terminal body as claimed in claim 1, wherein said body further includes a plurality of electric contacts, means supporting a portion of said contacts in each of said panels, said electric contacts having front ends and back ends, and flexible circuitry means interconnecting back ends of the electric contacts on said first panel with back ends of the electric contacts on said second panel, whereby the front ends of said contacts are enabled to couple to external circuits, and the back ends of said contacts are coupled in a selective manner to each other.

5. The modular interconnect terminal body as claimed in claim 2, in which the first latching means includes a retention spigot disposed on the free end of each said cantilevered strut, and the second latching means includes an orifice disposed in the first panel on the side opposite said plurality of elongated, interconnecting struts to receive and retain one said spigot.

6. The modular interconnect terminal body as claimed in claim 4, in which said first and second panels are substantially coplanar and support said contacts with said back ends oriented in a common direction for enabling interconnection of said back ends prior to the folding of said struts about said hinge means.

7. For a modular interconnect terminal of use in establishing electrical interconnections:

a body serving as a frame, said body including a first panel and a second panel cooperatively linked together along one side thereof by a plurality of elongated, interconnecting struts integral with said panels, integral hinge means disposed at the junction of each end of each said strut and the adjoining panel, each said hinge means including slots disposed in said adjoining panel in substantially parallel alignment with and on each side of said strut to extend said strut into said panel, and a transverse scoring groove disposed in the surface of said strut between said slots to facilitate folding of said frame, electric contacts supported in each of said panels, said electric contacts having front ends and back ends, and flexible means including conductive means interconnecting back ends of the electric contacts on said first panel with back ends of the electric contacts on said second panel, whereby the front ends of said contacts are positioned to couple to external circuits, and the back ends of said contacts are coupled in a selective manner to each other.

8. The modular interconnect terminal as claimed in claim 7, wherein said terminal further includes at least one cantilever strut integrally attached to and extending from the second panel of said frame on the side opposite said plurality of elongated, interconnecting struts, each said cantilever strut including at least one said hinge means at the junction between said strut and said second panel and about which the frame may be folded, first latching means associated with the cantilever strut, and second latching means associated with the first panel of said frame to latch with said first latching means when said frame is folded about said hinge means.

9. The terminal as claimed in claim 8, in which the unit frame is folded about said hinge means, and the first latching means is latched to said second latching means to substantially transversely align said first and second panels in a spaced-apart relation to form a modular interconnect terminal.

10. The terminal as claimed in claim 8, in which the first latching means includes a retention spigot disposed on the free end of each said cantilever strut, and the second latching means includes at least one orifice disposed in the first panel to receive and retain one said spigot.

11. The terminal as claimed in claim 7, in which the flexible means includes a flexible printed circuit board incorporating conductive means on at least one side, and the conductive means is made flexible to permit said circuit board to be folded with the frame.

12. An electrical interconnection module comprising:

a body folded to form a frame, said frame including a front panel and a back panel integral therewith, means integral to said frame to align said front and back panels in an overlapping, spaced-apart relation, said aligning means including a plurality of elongated struts interconnecting said front and back panels on one side thereof and at least one cantilever strut secured to the opposite side of said back panel and terminating in a retention spigot, said front panel including an aperture on its opposite side for receiving and retaining each said retention spigot, hinge means disposed at both ends of each of said plurality of elongated interconnecting struts and at the one end of each said cantilever strut secured to said back panel, each said hinge means including slots disposed in the panel adjoining said strut end in substantially parallel alignment with and on each side of said strut in an unfolded state to extend said strut into said panel, and a transverse scoring groove disposed in the surface of said strut between said slots, said strut being folded about the longitudinal axis of said scoring groove, electrical contacts supported by each of said panels, and means within said frame including flexible conductive means electrically interconnecting selected electrical contacts at the front and back panels.

13. The module as claimed in claim 12, in which the conductive means includes a flexible printed circuit board incorporating conductive means on at least one side, and the flexible printed circuit board is folded to fit within the frame.

14. In a modular interconnect terminal device for enabling two arrays of conductors to be positioned in back-to-back spaced relationship, the improvement therein comprising:

first and second plates each having an edge spaced from the adjacent plate, the first plate having means for carrying one array of connectors, the second plate having means for carrying another array of connectors, a first plurality of elongated spaced struts integrally formed with said plates and extending from one plate to the other plate between said edges, and a second plurality of cantilever struts integrally formed with said first of said plates and extending from another spaced edge of said first plate to free ends, said struts including hinge means disposed at each juncture between each said strut and a plate whereby they may be folded to position said plates in overlapping spaced-apart relationships, enabling the alignment of each array in back-to-back relationship with the other, each said hinge means including two slots disposed in the plate adjoining said strut in substantially parallel alignment with and on either side of said strut in an unfolded state to extend said strut into said adjoining plate, and a transverse scoring groove disposed in the back surface of said strut between said two slots, said strut being foldable about the longitudinal axis of said groove, and flexible means including conductive means for electrically and mechanically interconnecting conductors representing the back of one array with conductors representing the back of the other array.

15. The improvement as claimed in claim 14, including first latching means associated with said second plurality of cantilever struts, and second latching means associated with the second plate, said first and second latching means having a cooperative relationship enabling the free end of each strut of said second plurality of cantilever struts to be secured to the second plate to hold said plates in said overlapping relationship.

16. The improvement as claimed in claim 15, in which the first latching means includes a retention spigot, and the second latching means includes an aperture.

17. A method for forming modular interconnect terminals, comprising:

forming a substantially flexible body including a front panel and a back panel interconnected on one side by a plurality of elongated, integral struts, forming, on said back panel, at least one cantilever strut terminating in a retention spigot, forming slots in each said panel on each side of each connected strut end in substantially parallel alignment with said strut to extend said strut into said panel, forming a transverse scoring groove in the surface of each strut between said aligned slots to define an axis about which said strut is foldable, and forming, on said front panel, an aperture to receive and retain each said spigot.

18. The method of claim 17, including assembling a plurality of contacts with the substantially flexible body, and connecting selected conductors of a printed circuit board with said contacts to form a sub-assembly.

19. The method of claim 18, including bending said sub-assembly about the axes of said scoring grooves to form a box-like body, and connecting each said spigot with one said aperture to hold the body together.

20. The method of claim 18, including forming openings in said body to receive connectors, and placing connectors laden with contacts in said openings.

21. The modular interconnect terminal as claimed in claim 8, wherein each said elongated interconnecting strut includes a support rib disposed longitudinally along one surface thereof between the scoring grooves disposed at the end portions of said strut, and each said cantilever strut includes a support rib disposed longitudinally along one surface thereof between its free end and the scoring groove at its fixed end secured to said second panel, each said support rib including means for limiting movement of its associated strut relative to its adjoining panel during folding of said frame.

22. The module as claimed in claim 12, wherein each said elongated interconnecting strut includes a support rib disposed longitudinally along one surface thereof between the scoring grooves disposed at the end portions of said strut, and each said cantilever strut includes a support rib disposed longitudinally along one surface thereof between its retention spigot and the scoring groove at its fixed end adjoining said back panel, each said support rib including means for limiting movement of its associated strut relative to its adjoining panel during folding of said frame.

23. The improvement as claimed in claim 15, wherein each of said first plurality of spaced struts includes a support rib disposed longitudinally along one surface thereof between the scoring grooves disposed at the end portions of said strut, and each of said second plurality of cantilever struts includes a support rib disposed longitudinally along one surface thereof between its free end and the scoring groove at its fixed end secured to said second plate, each said support rib including means for limiting movement of its associated strut relative to its adjoining plate during folding of said device.

24. In a modular interconnect terminal for use in establishing electrical interconnections, an integral frame for supporting electrical connectors comprising:

first and second connector support panels; and plural strut means integrally interconnecting said support panels, each said strut means being secured to each adjoining support panel by integral hinge means for enabling said support panels and said strut means to be folded relative to each other, each said hinge means including means for forming an extension of said strut means in each adjoining support panel and means for defining a neck portion in said strut means extension for folding of said frame therealong.

25. The integral frame as described in claim 24, wherein said frame further includes second strut means connected to and extending from said second panel by one said hinge means on the side opposite said plural strut means for folding relative to said second support panel, said second strut means including latching means for connection to said first support panel when said plural strut means and said second strut means are folded relative to said first and second support panels.

26. The integral frame as described in claim 24, wherein said means for forming an extension comprises slot means extending into said adjoining support panel, and wherein said means for defining a neck portion comprises a beveled portion along said extension.

27. The integral frame as described in claim 26, wherein said plural strut means comprise a plurality of elongated strut elements, wherein each said slot means comprise a panel member defining a pair of slots therein on each side of one said strut element to extend said strut element into said panel member, and wherein each said beveled portion defines a transverse scoring groove disposed in the surface of said extension between said slots.

28. A modular interconnect terminal comprising:

an integral frame including first and second support panels cooperatively interconnected by at least one strut means, each said strut means being secured to each adjoining support panel by integral hinge means for enabling folding of said support panels and said strut means, each said hinge means including means for forming an extension of said strut means in each adjoining support panel and means for defining a neck portion in said strut means extension for folding of said frame therealong;

electrical contact means supported by each said support panel, said contact means on each said panel having front and back ends; and conductor means selectively interconnecting the back ends of said first panel contact means with the back ends of said second panel contact means, the front ends of said contact means being adapted for electrical coupling to external circuits.

* * * * *